United States Patent
Swoboda (10) Patent No.: US 6,754,852 B2
(45) Date of Patent: Jun. 22, 2004

(54) DEBUG TRIGGER BUILDER

(75) Inventor: Gary L. Swoboda, Sugar Land, TX (US)

(73) Assignee: Texas Instruments Incorporated, Dallas, TX (US)

(*) Notice: Subject to any disclaimer, the term of this patent is extended or adjusted under 35 U.S.C. 154(b) by 548 days.

(21) Appl. No.: 09/798,429

(22) Filed: Mar. 2, 2001

(65) Prior Publication Data

US 2001/0039488 A1 Nov. 8, 2001

Related U.S. Application Data

(60) Provisional application No. 60/186,326, filed on Mar. 2, 2000, and provisional application No. 60/219,340, filed on Mar. 2, 2000.

(51) Int. Cl.$^7$ ............................................... G06F 11/00
(52) U.S. Cl. ........................... 714/39; 714/25; 714/32; 714/34; 714/37; 714/45
(58) Field of Search ............................... 714/25, 32, 34, 714/37, 39, 45

(56) References Cited

U.S. PATENT DOCUMENTS 5,812,830 A * 9/1998 Naaseh-Shahry et al. ... 713/400
5,828,824 A    10/1998 Swoboda ............... 395/183.01
5,867,644 A *  2/1999 Ranson et al. ................. 714/39
6,134,676 A * 10/2000 VanHuben et al. ........... 714/39

OTHER PUBLICATIONS

ARM Limited, RDI 1.5.1tx and RDI 1.5.1rt; Doc. No. RDI–0032–CUST–ESPC–A; May 19, 2000; pp. 1–55.
ARM Limited, ETM9, Rev. 1, Technical Reference Manual, Doc. No. DDI 0157C, pp. —Index–3.
ARM Limited, Embedded Trace Macrocell, Rev. 1, Specification, Doc. No. IHI 0014E, pp. i—Index–3.

* cited by examiner

Primary Examiner—Nadeem Iqbal
Assistant Examiner—Christopher Euripidou
(74) Attorney, Agent, or Firm—Robert D. Marshall, Jr.; W. James Brady, III; Frederick J. Telecky, Jr.

(57) ABSTRACT

A trigger signal TRIG[0] is produced for use in debugging data processor (14) operations. The trigger signal can be generated in response to event information indicative of events associated with operations of the data processor and further in response to past behavior of a trigger signal. A plurality of intermediate terms index into a look up table loaded from a trigger builder control register. The look up table output is ANDed with output enable signals to produce plural trigger output signals.

24 Claims, 7 Drawing Sheets

| MUX SELECT | DESCRIPTION |
|---|---|
| D | SELECTED COUNTER, STATE, OR EXTERNAL EVENT D |
| C | SELECTED COUNTER, STATE, OR EXTERNAL EVENT C |
| B | PROGRAMMABLE AND/OR OUTPUT B |
| A | PROGRAMMABLE AND/OR OUTPUT A |

| TB I/O DEFINITION | | |
|---|---|---|
| SPEC NAME | TYPE | DESCRIPTION |
| A[15:00] | 1 | A INPUTS |
| B[15:00] | 1 | B INPUTS |
| C[31:00] | 1 | C INPUTS |
| D[31:00] | 1 | D INPUTS |
| GPR[12:00][3:0] | 1 | STATE EXTENSION LUTs |
| TBE[1:0] | 1 | TRIGGER BUILDER ENABLES |
| TRIG[12:00][3:0] | 0 | TRIGGER BUILDER OUTPUTS |

*FIG. 5*

| TB_BES | |
|---|---|
| 31:00 | |
| AND_OR_MASK_B[15:00] | AND_OR_MASK_A[15:00] |
| ALL BITS IMPLEMENTED FOR FULL SELECTION; ODD BITS IMPLEMENTED FOR HALF SELECTION | ALL BITS IMPLEMENTED FOR FULL SELECTION; EVEN BITS IMPLEMENTED FOR HALF SELECTION |

*FIG. 6*

| TB_CNTL | | | | |
|---|---|---|---|---|
| OUTPUT CONTROL | EVENTS SELECTS | | STATE ENABLE | PROGRAMMABLE BOOLEAN |
| 31:30 | 29:25 | 24:20 | 19:16 | 15:00 |
| OC[1:0] | ESD[4:0] | ESC[4:0] | ST_DIS[3:0] | BP_OP[15:00] |

```
QUAL<=false_h when (
        ((REG_ST_DIS[3]=true_h and STATE[3]=true_h) or
    (REG_ST_DIS [2]=true_h and STATE[2]=true_h) or
    (REG_ST_DIS [1]=true_h and STATE[1]=true_h) or
    (REG_ST_DIS [0]=true_h and STATE[0]=true_h)) or
    (TBE[1]=false_h and TBE[0]=false_h))
else true_h;
endif;
```

FIG. 9

```
SEXT<=true_h when (
        (GPR[n][3]=true_h and STATE[3]=true_h) or
    (GPR[n][2]=true_h and STATE[2]=true_h) or
    (GPR[n][1]=true_h and STATE[1]=true_h) or
    (GPR[n][0]=true_h and STATE[0]=true_h))
else false_h;
endif;
```

| EVENT GROUP | TERMS | SIGNIFICANCE OF INCLUSION |
|---|---|---|
| STATE[3:0] | D AND C | THE TRIGGER BUILDER EQUATION CAN BE SPLIT INTO TWO EQUATIONS FOR TWO STATES. NOT RECOMMENDED IF SIZE IMPORTANT. |
| STATE[3:0] | B AND A | STATES CAN BE ORed WITH OTHER EVENTS AND USED TO ACTIVATE TERMS A AND B. NOT RECOMMENDED. |
| AUX_EVT[3:0] | D AND C | THE TRIGGER BUILDER EQUATION CAN INCLUDE THE TRUE OR FALSE OF AUX_EVT. RECOMMENDED FOR IMPLEMENTED AUXILIARY EVENTS. |
| AUX_EVT[3:0] | B AND A | AUXILIARY EVENTS CAN BE ORed WITH OTHER EVENTS AND USED TO ACTIVATE TERMS A AND B. NOT RECOMMENDED IF SIZE IMPORTANT OR BUS EVENTS ARE AVAILABLE FOR INCLUSION INTO B AND A TERMS. |
| CNT_ZRO[3:0] | D AND C | THE TRIGGER BUILDER EQUATION CAN INCLUDE THE TRUE OR FALSE OF A COUNTER ZERO DETECT. RECOMMENDED FOR IMPLEMENTED COUNTERS EVENTS. |
| CNT_ZRO[3:0] | B AND A | COUNTER EVENTS CAN BE ORed WITH OTHER EVENTS AND USED TO ACTIVATE TERMS A AND B. NOT RECOMMENDED IF SIZE IMPORTANT OR BUS EVENTS ARE AVAILABLE FOR INCLUSION INTO B AND A TERMS. |
| BUS_EVT[15:00] | D AND C | THE TRIGGER BUILDER EQUATION CAN INCLUDE THE TRUE OR FALSE OF A BUS EVENT. INCLUSION OF 2 BUS EVENTS RECOMMENDED IF IT IS EXPECTED THAT TERMS A AND B WILL BE NEEDED TO CREATE THE LOGICAL OR OF THE BUS EVENTS ASSIGNED TERMS A AND B. (TERM A AND TERM B ARE INSUFFICIENT TO CREATE AN OR OF SUFFICIENT SIZE). |
| BUS_EVT[15:00] | B AND A | BUS EVENTS CAN BE ORed WITH OTHER EVENTS AND USED TO ACTIVATE TERMS A AND B. THE ORing OF BUS EVENTS IS SEEN AS THE PRIMARY USER FOR THESE TERMS. IF SIZE IS IMPORTANT, ASSIGN EVEN BUS EVENTS TO TERM A AND ODD BUS EVENTS TO TERM B, OTHERWISE ASSIGN ALL OR 3/4 OF THE BUS EVENTS TO BOTH TERMS. |

*FIG. 14*

DEBUG TRIGGER BUILDER

This application claims the priority under 35 U.S.C. 119(e) (1) of the following co-pending U.S. provisional applications: 60/186,326 filed on Mar. 2, 2000 now U.S. patent application Ser. No. 09/798,173; and 60/219,340 originally filed on Mar. 2, 2000 as non-provisional U.S. Ser. No. 09/515,093 and thereafter converted to provisional application status by a petition granted on Aug. 18, 2000.

FIELD OF THE INVENTION

The invention relates generally to electronic data processing and, more particularly, to emulation, simulation and test capabilities of electronic data processing devices and systems.

BACKGROUND OF THE INVENTION

Advanced wafer lithography and surface-mount packaging technology are integrating increasingly complex functions at both the silicon and printed circuit board level of electronic design. Diminished physical access is an unfortunate consequence of denser designs and shrinking interconnect pitch. Designed-in testability is needed, so that the finished product is still both controllable and observable during test and debug. Any manufacturing defect is preferably detectable during final test before a product is shipped. This basic necessity is difficult to achieve for complex designs without taking testability into account in the logic design phase, so that automatic test equipment can test the product.

In addition to testing for functionality and for manufacturing defects, application software development requires a similar level of simulation, observability and controllability in the system or sub-system design phase. The emulation phase of design should ensure that an IC (integrated circuit), or set of ICs, functions correctly in the end equipment or application when linked with the software programs.

With the increasing use of ICs in the automotive industry, telecommunications, defense systems, and life support systems, thorough testing and extensive realtime debug becomes a critical need.

Functional testing, wherein a designer is responsible for generating test vectors that are intended to ensure conformance to specification, still remains a widely used test methodology. For very large systems this method proves inadequate in providing a high level of detectable fault coverage. Automatically generated test patterns would be desirable for full testability, and controllability and observability are key goals that span the full hierarchy of test (from the system level to the transistor level).

Another problem in large designs is the long time and substantial expense involved. It would be desirable to have testability circuitry, system and methods that are consistent with a concept of design-for-reusability. In this way, subsequent devices and systems can have a low marginal design cost for testability, simulation and emulation by reusing the testability, simulation and emulation circuitry, systems and methods that are implemented in an initial device. Without a proactive testability, simulation and emulation approach, a large amount of subsequent design time is expended on test pattern creation and upgrading.

Even if a significant investment were made to design a module to be reusable and to fully create and grade its test patterns, subsequent use of the module may bury it in application specific logic, and make its access difficult or impossible. Consequently, it is desirable to avoid this pitfall.

The advances of IC design, for example, are accompanied by decreased internal visibility and control, reduced fault coverage and reduced ability to toggle states, more test development and verification problems, increased complexity of design simulation and continually increasing cost of CAD (computer aided design) tools. In the board design the side effects include decreased register visibility and control, complicated debug and simulation in design verification, loss of conventional emulation due to loss of physical access by packaging many circuits in one package, increased routing complexity on the board, increased costs of design tools, mixed-mode packaging, and design for produceability. In application development, some side effects are decreased visibility of states, high speed emulation difficulties, scaled time simulation, increased debugging complexity, and increased costs of emulators. Production side effects involve decreased visibility and control, complications in test vectors and models, increased test complexity, mixed-mode packaging, continually increasing costs of automatic test equipment even into the 7-figure range, and tighter tolerances.

Emulation technology utilizing scan based emulation and multiprocessing debug was introduced over 10 years ago. In 1988, the change from conventional in circuit emulation to scan based emulation was motivated by design cycle time pressures and newly available space for on-chip emulation. Design cycle time pressure was created by three factors: higher integration levels—such as on-chip memory; increasing clock rates—caused electrical intrusiveness by emulation support logic; and more sophisticated packaging—created emulator connectivity issues.

Today these same factors, with new twists, are challenging a scan based emulator's ability to deliver the system debug facilities needed by today's complex, higher clock rate, highly integrated designs. The resulting systems are smaller, faster, and cheaper. They are higher performance with footprints that are increasingly dense. Each of these positive system trends adversely affects the observation of system activity, the key enabler for rapid system development. The effect is called "vanishing visibility".

Application developers prefer visibility and control of all relevant system activity. The steady progression of integration levels and increases in clock rates steadily decrease the visibility and control available over time. These forces create a visibility and control gap, the difference between the desired visibility and control level and the actual level available. Over time, this gap is sure to widen. Application development tool vendors are striving to minimize the gap growth rate. Development tools software and associated hardware components must do more with less and in different ways; tackling the ease of use challenge is amplified by these forces.

With today's highly integrated System-On-a-Chip (SOC) technology, the visibility and control gap has widened dramatically. Traditional debug options such as logic analyzers and partitioned prototype systems are unable to keep pace with the integration levels and ever increasing clock rates of today's systems.

As integration levels increase, system buses connecting numerous subsystem components move on chip, denying traditional logic analyzers access to these buses. With limited or no significant bus visibility, tools like logic analyzers cannot be used to view system activity or provide the trigger mechanisms needed to control the system under development. A loss of control accompanies this loss in visibility, as it is difficult to control things that are not accessible.

To combat this trend, system designers have worked to keep these buses exposed, building system components in a way that enabled the construction of prototyping systems with exposed buses. This approach is also under siege from the ever-increasing march of system clock rates. As CPU clock rates increase, chip to chip interface speeds are not keeping pace. Developers find that a partitioned system's performance does not keep pace with its integrated counterpart, due to interface wait states added to compensate for lagging chip to chip communication rates. At some point, this performance degradation reaches intolerable levels and the partitioned prototype system is no longer a viable debug option. We have entered an era where production devices must serve as the platform for application development.

Increasing CPU clock rates are also accelerating the demise of other simple visibility mechanisms. Since the CPU clock rates can exceed maximum I/O state rates, visibility ports exporting information in native form can no longer keep up with the CPU. On-chip subsystems are also operated at clock rates that are slower than the CPU clock rate. This approach may be used to simplify system design and reduce power consumption. These developments mean simple visibility ports can no longer be counted on to deliver a clear view of CPU activity.

As visibility and control diminish, the development tools used to develop the application become less productive. The tools also appear harder to use due to the increasing tool complexity required to maintain visibility and control. The visibility, control, and ease of use issues created by systems-on-a-chip are poised to lengthen product development cycles.

Even as the integration trends present developers with a difficult debug environment, they also present hope that new approaches to debug problems will emerge. The increased densities and clock rates that create development cycle time pressures also create opportunities to solve them.

On-chip, debug facilities are more affordable than ever before. As high speed, high performance chips are increasingly dominated by very large memory structures, the system cost associated with the random logic accompanying the CPU and memory subsystems is dropping as a percentage of total system cost. The cost of a several thousand gates is at an all time low, and can in some cases be tucked into a corner of today's chip designs. Cost per pin in today's high density packages has also dropped, making it easier to allocate more pins for debug. The combination of affordable gates and pins enables the deployment of new, on-chip emulation facilities needed to address the challenges created by systems-on-a-chip.

When production devices also serve as the application debug platform, they must provide sufficient debug capabilities to support time to market objectives. Since the debugging requirements vary with different applications, it is highly desirable to be able to adjust the on-chip debug facilities to balance time to market and cost needs.

Since these on-chip capabilities affect the chip's recurring cost, the scalability of any solution is of primary importance. "Pay only for what you need" should be the guiding principle for on-chip tools deployment. In this new paradigm, the system architect may also specify the on-chip debug facilities along with the remainder of functionality, balancing chip cost constraints and the debug needs of the product development team.

The emulation technology of the present invention uses the debug upside opportunities noted above to provide developers with an arsenal of debug capability aimed at narrowing the control and visibility gap.

This emulation technology delivers solutions to the complex debug problems of today's highly integrated embedded real-time systems. This technology attacks the loss of visibility, control, and ease of use issues described in the preceding section while expanding the feature set of current emulators.

The on-chip debug component of the present invention provides a means for optimizing the cost and debug capabilities. The architecture allows for flexible combinations of emulation components or peripherals tailored to meet system cost and time to market constraints. The scalability aspect makes it feasible to include them in production devices with manageable cost and limited performance overhead.

DETAILED DESCRIPTION

Emulation, debug, and simulation tools of the present invention are described herein. The emulation and debug solutions described herein are based on the premise that, over time, some if not most debug functions traditionally performed off chip must be integrated into the production device if they are to remain in the developer's debug arsenal. To support the migration of debug functions on chip, the present invention provides a powerful and scalable portfolio of debug capabilities for on-chip deployment. This technology preserves all the gains of initial JTAG technology while adding capabilities that directly assault the visibility, control, and ease of use issues created by the vanishing visibility trend.

Four significant architectural infrastructure components spearhead the assault on the control and visibility gap described earlier herein:

1. Real-time Emulation (RTE);
2. Real-time Data Exchange (RTDX);
3. Trace; and
4. Advanced Analysis.

These components address visibility and control needs as shown in Table 1.

TABLE 1

Emulation System Architecture and Usage

| Architectural Component | Visibility Provisions | Control Provisions | Debug Usage |
| --- | --- | --- | --- |
| RTE | Static view of the CPU and memory state after background program is stopped. Interrupt driven code continues to execute. | Analysis components are used to stop execution of background program. | Basic debug Computational problems Code design problems |
| RTDX | Debugger software interacts with the application code to exchange commands and data while the application continues to execute. | Analysis components are used to identify observation points and interrupt program flow to collect data. | Dynamic instrumentation Dynamic variable adjustments Dynamic data collection |
| Trace | Bus snooper hardware collects selective program flow and data transactions for export without interacting with the application. | Analysis components are used to define program segments and bus transactions that are to be recorded for export. | Prog. Flow corruption debug Memory corruption Benchmarking Code Coverage Path Coverage Program timing problems |
| Analysis | Allows observation of occurrences of events or event sequences. Measure elapsed time between events. Generate external triggers. | Alter program flow after the detection of events or event sequences. | Benchmarking Event/sequence identification Ext. trigger generation Stop program execution Activate Trace and RTDX |

Real-Time Emulation (RTE) provides a base set of fixed capabilities for real-time execution control (run, step, halt, etc.) and register/memory visibility. This component allows the user to debug application code while real-time interrupts continue to be serviced. Registers and memory may be accessed in real-time with no impact to interrupt processing. Users may distinguish between real-time and non real-time interrupts, and mark code that must not be disturbed by real-time debug memory accesses. This base emulation capability includes hardware that can be configured as two single point hardware breakpoints, a single data watchpoint, an event counter, or a data logging mechanism. The EMU pin capability includes trigger I/Os for multiprocessor event processing and a uni-directional (target to host) data logging mechanism.

RTDX™ provides real-time data transfers between an emulator host and target application. This component offers both bi-directional and uni-directional DSP target/host data transfers facilitated by the emulator. The DSP (or target) application may collect target data to be transferred to the host or receive data from the host, while emulation hardware (within the DSP and the emulator) manages the actual transfer. Several RTDX transfer mechanisms are supported, each providing different levels of bandwidth and pin utilization allowing the trade off of gates and pin availability against bandwidth requirements.

Trace is a non-intrusive mechanism of providing visibility of the application activity. Trace is used to monitor CPU related activity such as program flow and memory accesses, system activity such as ASIC state machines, data streams and CPU collected data. Historical trace technology also used logic analyzer like collection and special emulation (SEs) devices with more pins than a production device. The logic analyzer or like device processed native representations of the data using a state machine like programming interface (filter mechanism). This trace model relied on all activity being exported with external triggering selecting the data that needed to be stored, viewed and analyzed.

Existing logic analyzer like technology does not, however, provide a solution to decreasing visibility due to higher integration levels, increasing clock rates and more sophisticated packaging. In this model, the production device must provide visibility through a limited number of pins. The data exported is encoded or compressed to reduce the export bandwidth required. The recording mechanism becomes a pure recording device, packing exported data into a deep trace memory. Trace software is used to convert the recorded data into a record of system activity.

On-chip Trace with high speed serial data export, in combination with Advanced Analysis provides a solution for SOC designs. Trace is used to monitor CPU related activity such as program flow and memory accesses, system activity such as ASIC state machines, data streams etc. and CPU collected data. This creates four different classes of trace data:

Program flow and timing provided by the DSP core (PC trace);

Memory data references made by the DSP core or chip level peripherals (Data reads and writes);

Application specific signals and data (ASIC activity); and CPU collected data.

Collection mechanisms for the four classes of trace data are modular allowing the trade off of functionality verses gates and pins required to meet desired bandwidth requirements.

The RTDX and Trace functions provide similar, but different forms of visibility. They differ in terms of how data is collected, and the circumstances under which they would be most effective. A brief explanation is included below for clarity:

RTDX™ (Real Time Data exchange) is a CPU assisted solution for exchanging information; the data to be exchanged have a well-defined behavior in relation to the program flow. For example, RTDX can be used to record the input or output buffers from a DSP algorithm. RTDX requires CPU assistance in collecting data hence there is definite, but small, CPU bandwidth required to accomplish this. Thus, RTDX is an application intrusive mechanism of providing visibility with low recurring overhead cost.

Trace is a non-intrusive, hardware-assisted collection mechanism (such as, bus snoopers) with very high bandwidth (BW) data export. Trace is used when there is a need to export data at a very high data rate or when the behavior of the information to be traced is not known, or is random in nature or associated with an address. Program flow is a typical example where it is not possible to know the behavior a priori. The bandwidth required to export this class of information is high. Data trace of specified addresses is another example. The bandwidth required to export data trace is very high.

Trace data is unidirectional, going from target to host only. RTDX can exchange data in either direction although unidirectional forms of RTDX are supported (data logging). The Trace data path can also be used to provide very high speed uni-directional RTDX (CPU collected trace data).

The high level features of Trace and RTDX are outlined in Table 2.

TABLE 2

RTDX and Trace Features

| Features | RTDX ™ | Trace |
|---|---|---|
| Bandwidth/pin | Low | High |
| Intrusiveness | Intrusive | Non-intrusive |
| Data Exchange | Bi-directional or uni-directional | Export only |
| Data collection | CPU assisted | CPU or Hardware assisted |
| Data transfer | No extra hardware for minimum BW (optional hardware for higher BW) | Hardware assisted |
| Cost | Relatively low recurring cost | Relatively high recurring cost |

Advanced analysis provides a non-intrusive on-chip event detection and trigger generation mechanism. The trigger outputs created by advanced analysis control other infrastructure components such as Trace and RTDX. Historical trace technology used bus activity exported to a logic analyzer to generate triggers that controlled trace within the logic analyzer unit or generated triggers which were supplied to the device to halt execution. This usually involved a chip that had more pins than the production device (an SE or special emulation device). This analysis model does not work well in the System-on-a-Chip (SOC) era as the integration levels and clock rates of today's devices preclude full visibility bus export.

Advanced analysis provides affordable on-chip instruction and data bus comparators, sequencers and state machines, and event counters to recreate the most important portions of the triggering function historically found off chip. Advanced analysis provides the control aspect of debug triggering mechanism for Trace, RTDX and Real-Time Emulation. This architectural component identifies events, tracks event sequences, and assigns actions based on their occurrence (break execution, enable/disable trace, count, enable/disable RTDX, etc.). The modular building blocks for this capability include bus comparators, external event generators, state machines or state sequencers, and trigger generators. The modularity of the advanced analysis system allows the trade off of functionality versus gates.

Emulator capability is created by the interaction of four emulator components:
1. debugger application program;
2. host computer;
3. emulation controller; and
4. on-chip debug facilities.

Figure 1:
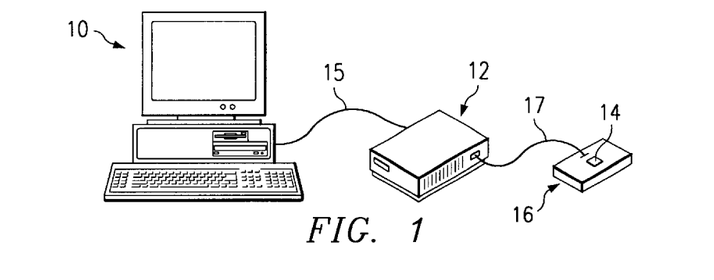
FIG. 1 diagrammatically illustrates exemplary embodiments of an emulation system according to the invention.

These components are connected as shown in FIG. 1. The host computer 10 is connected to an emulation controller 12 (external to the host) with the emulation controller (also referred to herein as the emulator or the controller) also connected to the target system 16. The user preferably controls the target application through a debugger application program, running on the host computer, for example, Texas Instruments' Code Composer Studio program.

A typical debug system is shown in FIG. 1. This system uses a host computer 10 (generally a PC) to access the debug capabilities through an emulator 12. The debugger application program presents the debug capabilities in a user-friendly form via the host computer. The debug resources are allocated by debug software on an as needed basis, relieving the user of this burden. Source level debug utilizes the debug resources, hiding their complexity from the user. The debugger together with the on-chip Trace and triggering facilities provide a means to select, record, and display chip activity of interest.

Trace displays are automatically correlated to the source code that generated the trace log. The emulator provides both the debug control and trace recording function. The debug facilities are programmed using standard emulator debug accesses through the target chips' JTAG or similar serial debug interface. Since pins are at a premium, the technology provides for the sharing of the debug pin pool by trace, trigger, and other debug functions with a small increment in silicon cost. Fixed pin formats are also supported. When the sharing of pins option is deployed, the debug pin utilization is determined at the beginning of each debug session (before the chip is directed to run the application program), maximizing the trace export bandwidth. Trace bandwidth is maximized by allocating the maximum number of pins to trace.

The debug capability and building blocks within a system may vary. The emulator software therefore establishes the configuration at run-time. This approach requires the hardware blocks to meet a set of constraints dealing with configuration and register organization. Other components provide a hardware search capability designed to locate the blocks and other peripherals in the system memory map. The emulator software uses a search facility to locate the resources. The address where the modules are located and a type ID uniquely identifies each block found. Once the IDs are found, a design database may be used to ascertain the exact configuration and all system inputs and outputs.

The host computer is generally a PC with at least 64 Mbytes of memory and capable of running at least Windows95, SR-2, Windows NT, or later versions of Windows. The PC must support one of the communications interfaces required by the emulator, for example:

Ethernet 10T and 100T, TCP/IP protocol;

Universal Serial Bus (USB), rev 1.x;

Firewire, IEEE 1394; and/or

Parallel Port (SPP, EPP, and ECP).

The emulation controller 12 provides a bridge between the host computer 10 and target system 16, handling all debug information passed between the debugger application running on the host computer and a target application executing on a DSP (or other target processor) 14.

One exemplary emulator configuration supports all of the following capabilities:

Real-time Emulation;

RTDX;

Trace; and

Advanced Analysis.

Additionally, the emulator-to-target interface supports:

Input and output triggers;

Bit I/O; and

Managing special extended operating modes.

The emulation controller 12 accesses Real-time Emulation capabilities (execution control, memory, and register access) via a 3, 4, or 5 bit scan based interface. RTDX capabilities can be accessed by scan or by using three higher bandwidth RTDX formats that use direct target-to-emulator connections other than scan. The input and output triggers allow other system components to signal the chip with debug events and vice-versa.

The emulator 12 is partitioned into communication and emulation sections. The communication section supports communication with the host 10 on host communication links while the emulation section interfaces to the target, managing target debug functions and the device debug port. The emulator 12 communicates with the host computer 10 using e.g., one of the aforementioned industry standards communication links at 15. The host-to-emulator connection can be established with off the shelf cabling technology. Host-to-emulator separation is governed by the standards applied to the interface used.

The emulation controller 12 communicates with the target system 16 through a target cable or cables at 17. Debug, Trace, Triggers, and RTDX capabilities share the target cable, and in some cases, the same device pins. More than one target cable may be required when the target system deploys a trace width that cannot be accommodated in a single cable. All trace, RTDX, and debug communication occurs over this link.

Figure 2:
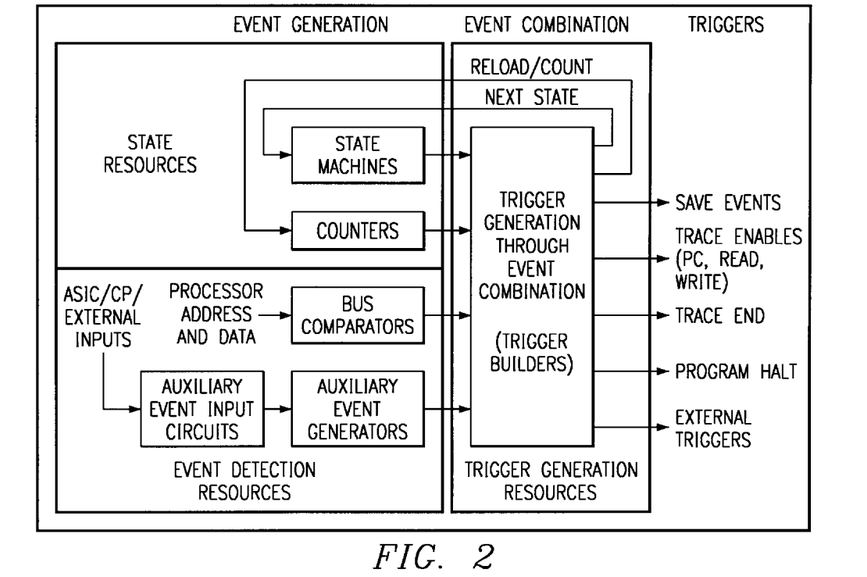
FIG. 2 diagrammatically illustrates exemplary embodiments of a triggering architecture according to the invention.

FIG. 2 diagrammatically illustrates exemplary embodiments of a triggering architecture which can be provided, for example, in a device such as the target device 14 of FIG. 1. The exemplary triggering architecture of FIG. 2 includes an event generation portion and an event combination portion. The event combination portion includes state resources including state machines and counters, and also includes detection resources, including comparators for buses, auxiliary event generators for bits, etc. The detection resources create events based, for example, on bus, ASIC, or external inputs. The state resources, including counters and state machines, can be programmed to remember previous trigger sequences or to count a number of previous triggers.

The event combination portion of FIG. 2 includes combinational trigger generation resources which receive the outputs of the detection and state resources. The combinational trigger generation resources combine the outputs of the detection and state resources to create triggers.

The detection and state resources of FIG. 2 are basically event generators. The detection resources can, for example, continuously monitor bus activity or auxiliary event activity. For example, the detection resources can monitor bus values captured at the end of a pipeline stage of a data processing core within the target chip 14 of FIG. 1. When the captured bus values match a predefined event criteria, an event is asserted, for example, for the duration of the pipeline stage after the matching condition is captured. Auxiliary events can be asserted for the period during which the input condition is active.

The triggers produced by the trigger generation resources can be used, for example, to control trace, counter, state machine and other functions. A trigger builder within the trigger generation resources of FIG. 2 generates a trigger when the event generation resources indicate that a predefined combination of events has occurred. The trigger builder can: select the events that are monitored for trigger conditions; evaluate whether the selected events match a trigger condition or conditions; and route the trigger(s) to the appropriate function(s) controlled by the trigger(s).

The state machines and counters of FIG. 2 can perform the following exemplary functions: detecting the occurrence of simple or complex trigger sequencing; counting the occurrence of simple or complex trigger sequences; and measuring the time duration of triggers or the amount of time between triggers. The triggers produced by the trigger generation resources can be used to manage each counter function (count/reload, count/clear, or timer start/timer stop) and to move the state machines through their state sequences. The triggers are formed from one or more events. In some exemplary embodiments, an event can be defined as: a specific state machine state (a local event); a counter value counting to 0 (another local event); a bus comparison match or mismatch (a bus event); or an ASIC input comparison match or mismatch (an auxiliary event). In various embodiments, the state machines can be operated in modes such as: a state machine including two state sequencers with two states; and a state machine with four states that can be directed to move to any of the four states from any other state.

The counters of FIG. 2 can be provided in the following exemplary configurations: a counter with a count input and a clear input; a counter with a count input and a reload input; a timer with a start input and a stop input; a combination of a counter with a count input and a clear input, and a timer with a start input and a stop input (which can operate as either a counter or a timer on an as needed basis); and a combination of a counter with a count input and a reload input, and a timer with a start input and a stop input (which can operate as either a counter or a timer on an as needed basis). In some embodiments, the counters/timers can be either 16-bit or 32-bit devices. A counter decrementing to 0 can generate an event, but merely initializing a counter to 0 does not generate an event.

Events associated with the state resources remain asserted as long as the event-generating condition exists. For example, a counter counting from 1 to 0 creates an event which will remain asserted until the counter is either reloaded or directed to count again.

As mentioned above, the basic element of the event-combining, trigger generation resources is the trigger builder. A trigger builder can process the events presented to it with a complex Boolean function. This function is capable of performing IF then ELSE operation in conjunction with other trigger builders. Separate trigger builders (or separate groups of trigger builders) can be used to create separate triggers that can in turn be used to control each desired action, for example, counter reload, count, breakpoint, etc.

Figure 3:
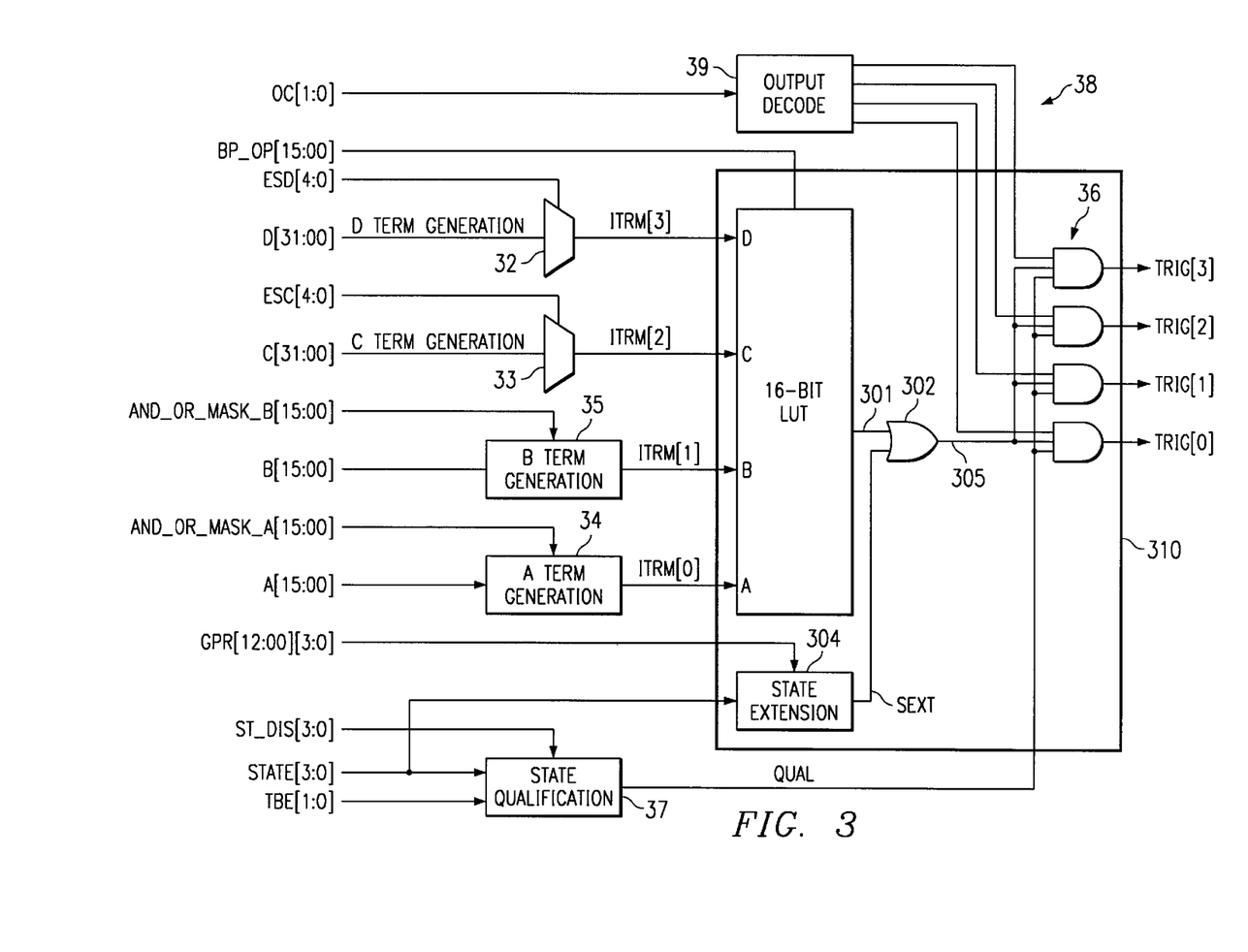
FIG. 3 diagrammatically illustrates exemplary embodiments of a trigger builder of FIG. 2.

FIG. 3 diagrammatically illustrates exemplary embodiments of a trigger builder according to the invention. The trigger builder of FIG. 3 uses the output of the aforementioned event generators to create four intermediate terms designated as ITRM(0), ITRM(1), ITRM(2), and ITRM(3) in FIG. 3. These intermediate terms are applied to inputs A, B, C and D which address a look up table (LUT) to define the trigger builder output. The aforementioned intermediate terms ITRM(0)–ITRM(3) are also referred to herein as intermediate terms A–D respectively. Term C and term D are each formed by selecting a single event signal from among 32 event signals available at the inputs of selectors 32 and 33. Term A and term B are created in some embodiments by logically ORing or ANDing a plurality of event signals available at the inputs of A term generation logic 34 and B term generation logic 35. If the OR operation is performed at 34 or 35, then the corresponding output term A or B is declared as high true, whereas if the AND operation is performed at 34 or 35, then the output term A or B is declared as low true. The high true/low true sense is programmable at the point where the event is generated. In some embodiments, other logic operations can be implemented by the logic 34 and/or the logic 35.

Any combination of the intermediate terms A, B, C and D can be used to declare a trigger builder output. In addition, the trigger builder output is qualified at AND gates 36 by a signal QUAL indicative of the machine state of a state machine 37. Any or all states of the state machine 37 can be used as the basis for asserting the signal QUAL. In the embodiment of FIG. 3, the trigger builder output is also qualified at AND gates 36 by a plurality of enable signals 38 produced by a decoder 39 that is controlled by debug software.

Some exemplary trigger builder equations include: (A and B and C) or D; (A or B or C) and D; and (A and B and C)' or D. Triggers can also be generated using simple constructs such as the following examples: IF (A and B) then trigger X; IF (A)' then trigger X; and IF (A and B)' then trigger X. More sophisticated constructs such as the following examples are also available: IF (A and B) then trigger X, ELSE IF (B)' then trigger X, ELSE IF (A' and D) then trigger X, ELSE IF (A and C) then trigger X.

As one specific example, a trigger condition can be defined as: If not in function A and if not in function B and if not in function C and if a data write to a predetermined variable occurs, then trigger. Any number of triggers can be generated simultaneously by plural trigger builders, controlling actions such as the following: signal an external trigger; increment a loop counter; reload a loop counter; redirect program flow (breakpoint or watchpoint); selectively trace program flow; selectively trace processor reads; or selectively trace processor writes.

The event generators associated with processor buses monitor the processor bus activity and control signals. The fetch, execute, read and write buses can be monitored to determine when instructions are fetched and executed, and when memory reads and writes occur. The monitoring of instruction execution can be important because, in most cases, it is desirable for events relating to program flow to be qualified by instruction execution. The monitoring of instruction execution prevents the declaration of an event on instructions that are fetched, but not executed (e.g. an instruction following a branch or an instruction discarded by an interrupt).

Trigger creation is a multi-stage process. In the first stage, the four intermediate terms A–D are created. In the second stage, the intermediate terms are used to address the look up table LUT, for example a 16-to-1 multiplexer, that defines a Boolean operation. Also in the second stage, the output 301 of the look up table is combined at OR gate 302 with the output SEXT of state extension logic 304. In the third stage of trigger creation, the enable signals 38 and the QUAL signal qualify the OR gate output 305 at AND gates 36, allocating the trigger to one of, in this example, four functions.

The state qualification logic 37 permits a state machine such as illustrated in FIG. 2 to disable trigger generation. In some embodiments, the state qualification logic 37 is implemented as a 4-bit look up table that is addressed by the state machine state, namely STATE[3:0]. The look up table identifies the states where trigger creation is not permitted and drives the QUAL signal appropriately to enable or disable trigger creation. The look up table can be programmed to reflect the desired qualification for any state machine state. In some embodiments, the state machine states can be indicative of prior behavior of: the trigger that is being disabled; another trigger or triggers; or all of the aforementioned triggers.

The table look up multiplexer LUT can be viewed as a logic gate whose function is programmable, for example, by 16 register bits BP_OP as shown in FIG. 3. The multiplexer select lines A–D are respectively driven by the aforementioned intermediate terms. The Boolean logic operation performed on the four inputs is created by the multiplexer input programmation defined by the bits BP_OP. All combinations of the four inputs A–D are detectable, and any number of the 16 programmation bits can be set TRUE.

Figure 4:
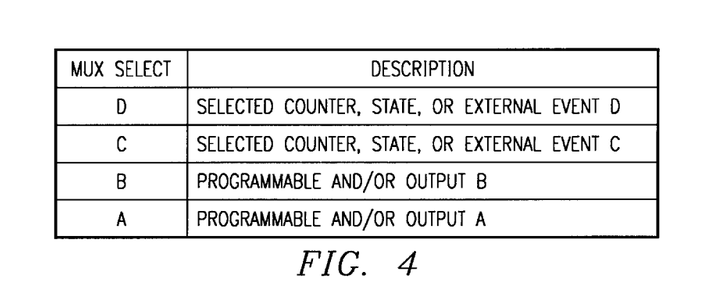
FIGS. 4–6 illustrate in tabular format control, input and output signals utilized in the trigger builder of FIG. 3.

FIG. 4 illustrates in tabular format examples of the multiplexer select inputs A–D.

Figure 5:
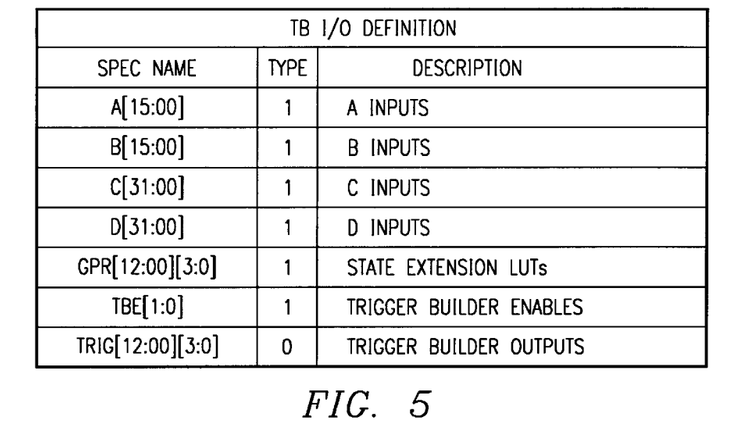

FIG. 5 illustrates in tabular format the input and output signals of the trigger builder of FIG. 3.

Figure 6:
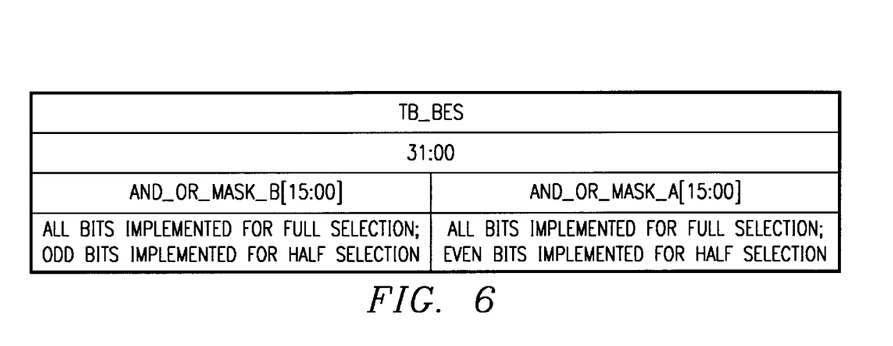

FIG. 6 illustrates an example of a trigger builder bus event selection (TB_BES) register which controls operation of the A term generation logic 34 and the B term generation logic 35 of FIG. 3. In some embodiments, this register specifies which bus events are to be logically ANDed or ORed to create intermediate terms A and B. The AND_OR_MASK_A portion of the register selects the bus events used to generate intermediate term A and the AND_OR_MASK_B portion of the register selects the bus events used to generate intermediate term B. The TB_BES register is defined so that either all or half of the bus events can be selected for either intermediate term A or B. In the case where only even bus events are selected for term B, all odd bits in AND_OR_MASK_B are unimplemented and reserved, and all even bits in AND_OR_MASK_A are unimplemented and reserved. For the case where all bus events are available for selection into both intermediate terms A and B, all bits of AND_OR_MASK_A and AND_OR_MASK_B are implemented.

Figure 7:
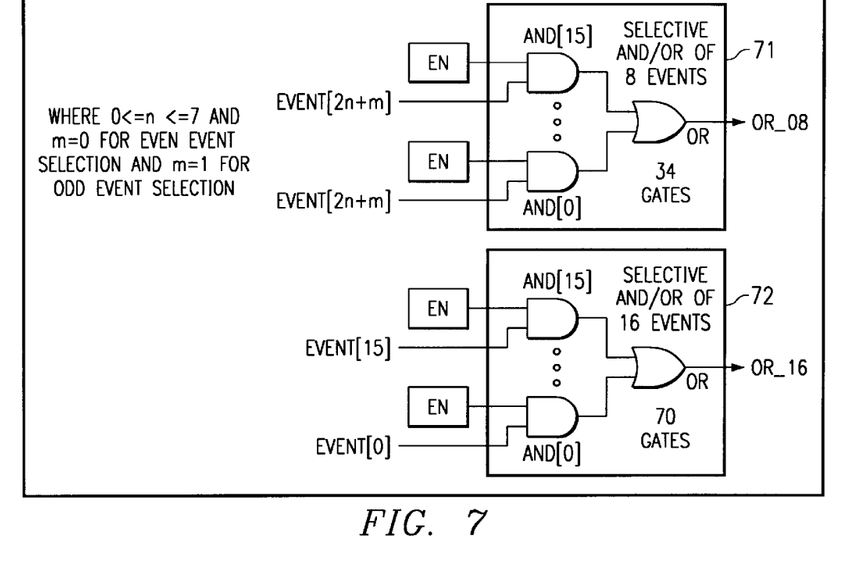
FIG. 7 diagrammatically illustrates exemplary embodiments of AND/OR logic blocks which can be utilized to generate intermediate terms in FIG. 3.

FIG. 7 diagrammatically illustrates exemplary embodiments of the A and B term generation logic at 34 and 35 of FIG. 3. The logic at 71 is an example wherein the TB_BES register of FIG. 6 selects only half of the input events, in this example 8 of 16 events. In the logic illustrated at 72, the TB_BES selects all of the input events. The AND/OR logic blocks 71 and 72 of FIG. 7 can be used to implement either a logical AND operation or a logical OR operation on up to 16 inputs. The inputs are defined as low true for the AND operation and high true for the OR operation. The output is low true for the AND operation and high true for the OR operation.

Figure 8:
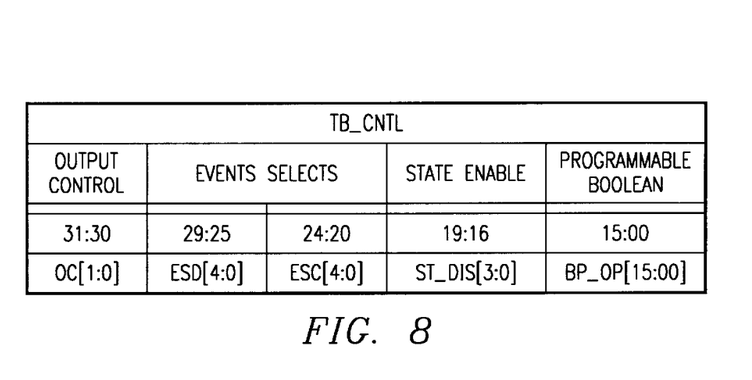
FIG. 8 illustrates in tabular format further control signals utilized in the trigger builder of FIG. 3.

FIG. 8 illustrates a trigger builder control register (TB_CNTL) which provides various control signals to the trigger builder of FIG. 3. The 16 bits designated as BP_OP provide the programmation of the look up table LUT of FIG. 3, the four bits designated as ST_DIS provide the programmation of the state qualification look up table 37 of FIG. 3. In particular, each of the four ST_DIS bits indicates whether a corresponding one of the four states of the state machine (STATE[3:0]) should qualify the trigger builder output. The five bits designated as ESC in FIG. 8 are provided as selection control inputs to the selector 33 of FIG. 3, and the five bits designated as ESD in FIG. 8 provide the selection control inputs to the selector 32 of FIG. 3. The two bits designated as OC in FIG. 8 are decoded by the output decoder 39 of FIG. 3 to determine which of the trigger outputs TRIG[0]–TRIG[3] should be driven by signal 305.

Figure 9:
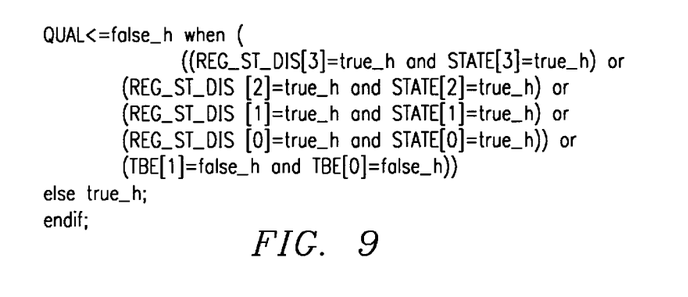
FIG. 9 illustrates a logical equation which can be implemented by the state qualification logic of FIG. 3.

FIG. 9 illustrates one example of how the QUAL signal of FIG. 3 can be generated by the state qualification logic 37 of FIG. 3. In the example of FIG. 9, when QUAL is false_h, the AND gates 36 of FIG. 3 are disabled, and when QUAL is true_h, this qualifies the other signal inputs at the AND gates 36.

It can be seen from the foregoing description that the trigger builder function is governed by the following format: Trigger Builder Out=(any combination of Terms A, B, C, D AND State Qualification AND Enable Qualification). This permits implementation of equations such as the following examples:

Counter_A_Zero and not_External_Event_3 and Address_Range_2;

Counter_A_Zero or !Address_Range_3 and Address_Indentity_Compare_2;

Counter_A_Zero and !Address_Range_3 and Address_Identity_Compare_2;

Counter_A_Zero or Counter_C_Zero and !Address_Range_3 and Address_Identity_Compare_2);

External_Event_D or Counter_C_Zero and (!Address_Range_3 and (Address_Identity_Compare_2 or Address_Identity_Compare_6));

External_Event_D or Counter_C_Zero or !Address_Range_3 or Address_Identity_Compare_2 or Address_Identity_Compare_6;

External_Event_D or Counter_C_Zero or !Address_Range_3 or Address_Identity_Compare_2 or Address_Identity_Compare_6;

External_Event_D or Counter_C_Zero or !(Address_Range_3 or Address_Identity_Compare_2 or Address_Identity_Compare_6); and (External_Event_D and Counter_C_Zero) or !(Address_Range_3 or Address_Identity_Compare_2 or Address_Identity_Compare_6).

In the foregoing equations, the symbol "!" represents the logical invert function.

Figure 10:
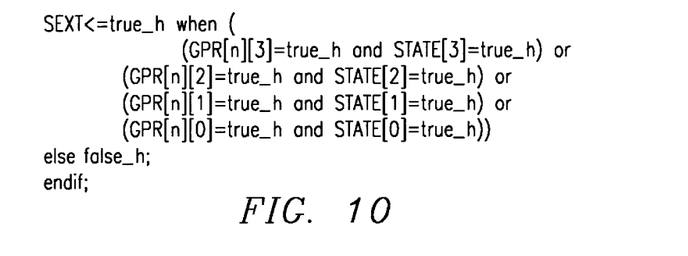
FIG. 10 illustrates a logical equation which can be implemented by the state extension logic of FIG. 3.

Referring again to FIG. 3, the state extension logic 304 is provided to perform a state only function (e.g., if STATE 0, then trigger) that is best implemented without using the LUT of FIG. 3. The state extension logic 304 can be used, for example, when it is desirable for a certain trigger is to be asserted whenever the state machine assumes a specific state. This preserves the use of the LUT, for example, for more complex trigger equations used in other states. Thus, the state extension logic 304 receives the state machine state as one input and receives four bits of a general purpose register (GPR) as another input, these latter four bits serving to program which states of the state machine should activate the signal SEXT at the output of state extension logic 304. FIG. 10 illustrates an exemplary equation which can be used by the state extension logic 304 to produce the signal SEXT.

Figure 11:
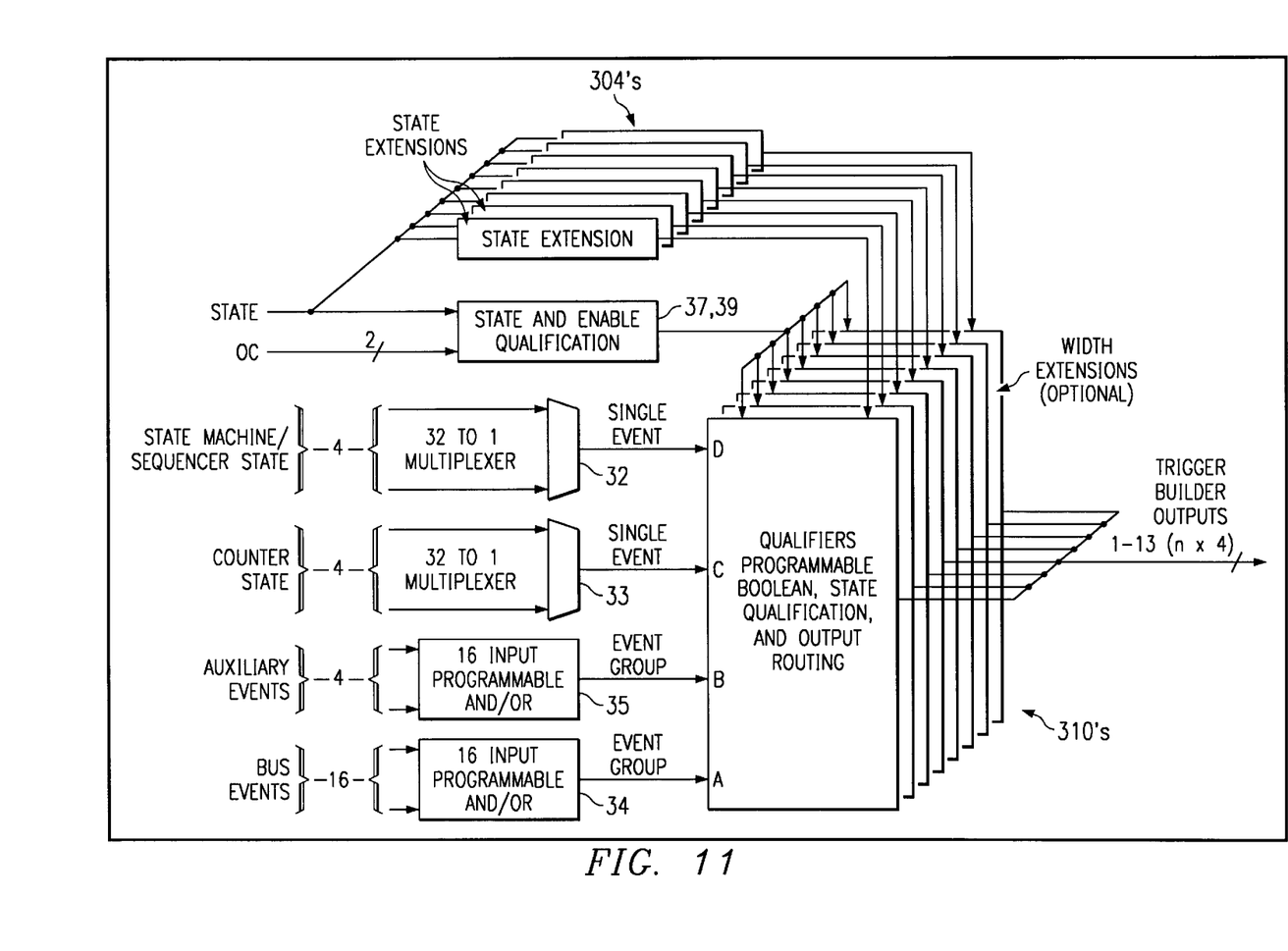
FIG. 11 diagrammatically illustrates exemplary embodiments of an extended trigger builder according to the invention.

FIG. 11 diagrammatically illustrates exemplary embodiments of an extended trigger builder according to the invention. The trigger builder embodiment of FIG. 11 basically illustrates that the core portion 310 of the trigger builder of FIG. 3 can be duplicated n times (up to n=13 in the example of FIG. 11). This extends the width of the trigger builder as illustrated. The components that drive the trigger builder core 310 in FIG. 3 also drive each of the illustrated trigger builder cores 310 of FIG. 11 in generally the same fashion. Also in the embodiment of FIG. 11, the trigger builder cores 310 are respectively driven by a plurality of individual state extension logic blocks 304. The general purpose register GPR shown in FIG. 3 and FIG. 10 can thus contain, in some embodiments, up to thirteen sets of four bits each, wherein each set of four bits is used to control one of the n state extension logic blocks of FIG. 11.

Figure 12:
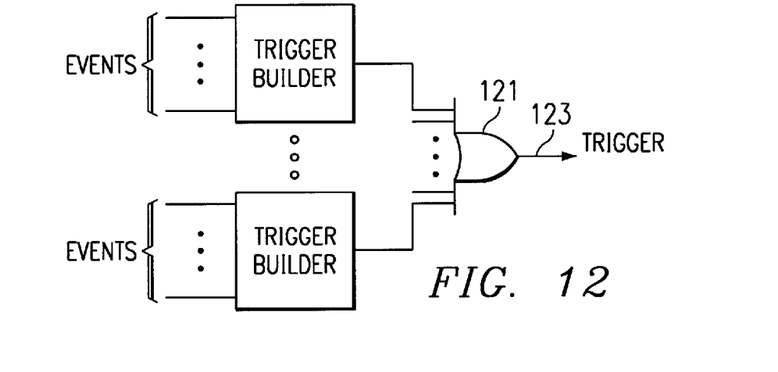
FIG. 12 diagrammatically illustrates exemplary embodiments of a combined trigger builder according to the invention.

FIG. 12 diagrammatically illustrates an exemplary trigger builder embodiment wherein respective trigger outputs from a plurality of trigger builders such as illustrated in FIG. 3 are combined, in this example by an OR gate, to produce a combined trigger. For example, and referring also to FIG. 3, the TRIG[0] signals from a plurality of trigger builders could be input to the OR gate 121 of FIG. 12 to produce the combined trigger signal 123.

Figure 13:
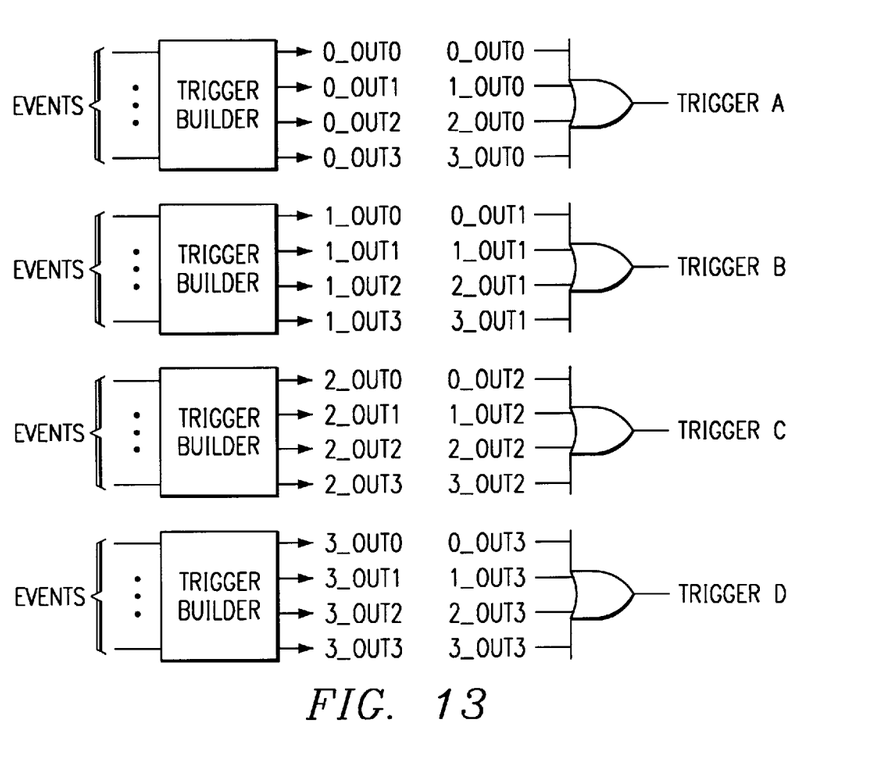
FIG. 13 illustrates exemplary embodiments of a multiple-combined trigger builder according to the invention.

FIG. 13 illustrates further exemplary embodiments of trigger builders according to the invention. The embodiments of FIG. 13 indicate that trigger builder outputs can be distributed to produce triggers in any desired manner. In the example of FIG. 13, the trigger builder outputs 0_OUT0–0_OUT3, 1_OUT0–1_OUT3, 2_OUT0–2_OUT3 and 3_OUT0–3_OUT3 can be distributed as shown to a plurality of OR gates to produce trigger A, trigger B, trigger C and trigger D. For example, one output of all trigger builders can be assigned to a break function. Another output of all, or part of, the trigger builders can be assigned to a trace function, for example a "don't store" trace sample. Other trigger outputs could be assigned to a data trace trigger. Finally, remaining outputs can be connected to a wide range of triggers, such as counter reload and count functions, external triggers or ASIC triggers.

Figure 14:
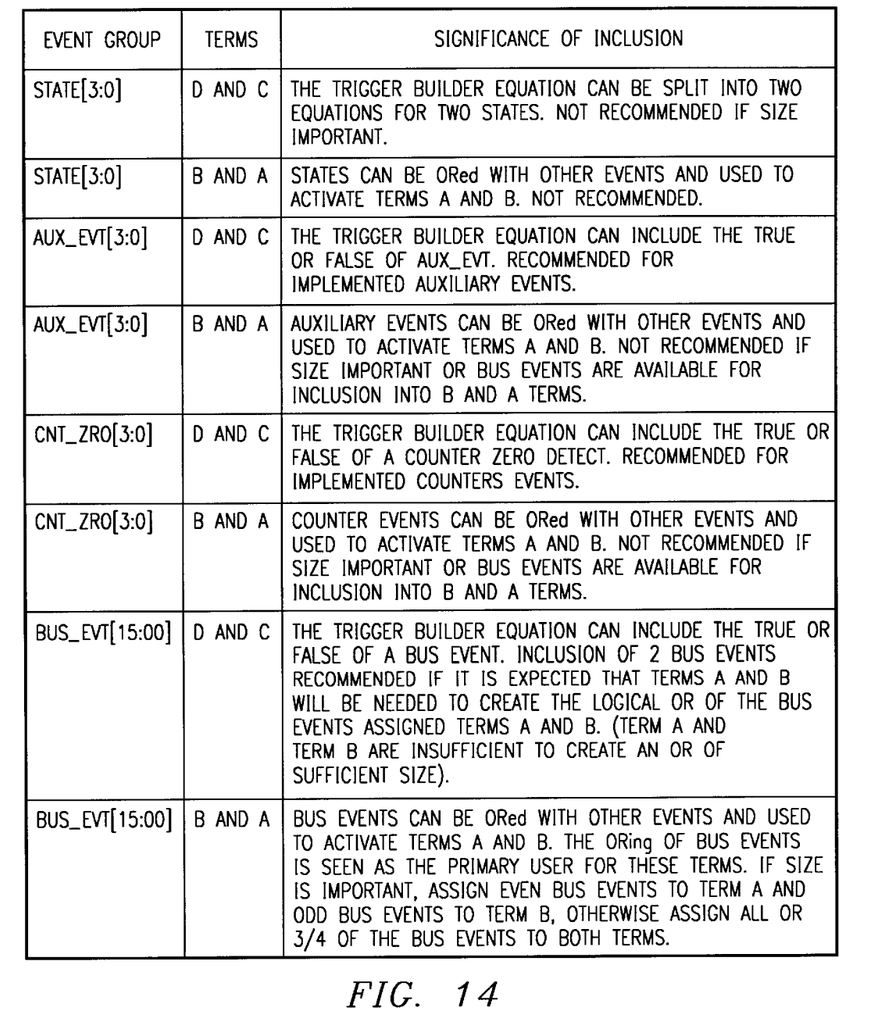
FIG. 14 illustrates in tabular format various event groups which can be included in various intermediate terms of FIG. 3, and exemplary explanations of the significance of such inclusion.

FIG. 14 illustrates in tabular format exemplary events which can be used to create the four intermediate terms A–D of FIG. 3. In FIG. 14, the illustrated event groups include auxiliary events (AUX_EVT), counter events (CNT_ZRO), bus events (BUS_EVT), and the aforementioned state of the state machine (STATE). FIG. 14 describes the significance of including the various event groups in the various intermediate terms.

Although exemplary embodiments of the invention are described above in detail, this does not limit the scope of the invention, which can be practiced in a variety of embodiments.

What is claimed is:

1. A method of producing a trigger signal for use in debugging the operation of a data processor, comprising:

receiving a plurality of event signals associated with operation of the data processor;

generating a plurality of intermediate terms, each intermediate term responsive to a subset of the events;

storing control data in a trigger builder control register;

loading a look up table with first predetermined bits of the control data stored in the trigger builder control register;

applying the plurality of intermediate terms together as an index into the look up table and recalling a single corresponding bit from the look up table;

generating a plurality of trigger output enable signals; and generating a plurality of trigger output signals by ANDing the single bit output from the look up table with respective trigger enable signals.

2. The method of producing a trigger signal of claim 1, wherein:

said step of generating a plurality of intermediate terms includes generating at least one intermediate term by receiving a plurality of event signals, ANDing each event signal with a corresponding one of a plurality of AND_OR mask signals generating a plurality of AND signals, and ORing the plurality of AND signals to produce the intermediate term.

3. The method of producing a trigger signal of claim 2, further comprising:

recalling the plurality of AND_OR mask signals from second predetermined bits of the control data stored in the trigger builder control register.

4. The method of producing a trigger signal of claim 1, wherein:

said step of generating a plurality of intermediate terms includes generating at least one intermediate term by receiving a plurality of event signals, selecting one of the plurality of event signals corresponding to a multibit select signal to produce the intermediate term.

5. The method of producing a trigger signal of claim 4, further comprising:

recalling the multibit select signal from second predetermined bits of the control data stored in the trigger builder control register.

6. The method of producing a trigger signal of claim 1, further comprising:

generating a state extension signal; and

ORing the single bit output from the look up table with the state extension signal before ANDing with the respective trigger enable signals.

7. The method of producing a trigger signal of claim 6, wherein:

the state extension signal corresponds to a state of the data processor.

8. The method of producing a trigger signal of claim 7, wherein:

the step of generating a state extension signal includes
loading a second look up table with second predetermined bits of data stored in a register,
receiving a plurality of state bits from the data processor corresponding to a state of the data processor, and
applying the plurality of state bits together as an index into the second look up table and recalling a single corresponding bit from the look up table as the state extension signal.

9. The method of producing a trigger signal of claim 1, further comprising:

generating a qualification signal; and the step of generating a plurality of trigger output signals further includes ANDing the single bit output from the look up table with both the respective trigger enable signals and the qualification signal.

10. The method of producing a trigger signal of claim 9, wherein:

the qualification signal corresponds to a state of the data processor.

11. The method of producing a trigger signal of claim 10, wherein:

the step of generating a state extension signal includes
loading a second look up table with second predetermined bits of data stored in the trigger builder control register,
receiving a plurality of state bits from the data processor corresponding to a state of the data processor, and
applying the plurality of state bits together as an index into the second look up table and recalling a single corresponding bit from the look up table as the qualification signal.

12. The method of producing a trigger signal of claim 1, wherein:

the step of generating a plurality of trigger output enable signals includes
recalling a plurality of bits from second predetermined bits of the control data stored in the trigger builder control register, and
decoding the second predetermined bit of the control data into the plurality of trigger output enable signals where one and only one trigger output enable signal has a first digital state for enabling the corresponding trigger output and other trigger output enable signals have a second digital state opposite to first digital state.

13. An apparatus for producing a trigger signal for use in debugging the operation of a data processor, comprising:

a plurality of inputs each receiving a corresponding one of a plurality of event signals associated with operation of the data processor;

a plurality of intermediate terms units, each intermediate term unit connected to said plurality of inputs and generating an intermediate term signal responsive to a subset of the events;

a trigger builder control register storing control data;

a look up table having a plurality of index inputs receiving respective intermediate terms and a single output, said look up table loaded with first predetermined bits of the control data stored in the trigger builder control register;

a trigger output enable signal generator generating a plurality of trigger output enable signals; and a plurality AND gates, each AND gate having a first input receiving said output of said look up table, a second input receiving a corresponding trigger output enable signal and an output generating a corresponding trigger output signal.

14. The apparatus for producing a trigger signal of claim 13, wherein:

at least one intermediate term unit includes
a plurality of event signal inputs,
a plurality of AND_OR mask inputs;
a plurality of AND gates, each AND gate having a first input receiving a corresponding one of said plurality of event signals, a second input receiving a corresponding one of said plurality of AND_OR mask signals and an output, and
an OR gate having a plurality of inputs receiving said outputs of respective AND gates and an output producing said intermediate term signal.

15. The apparatus for producing a trigger signal of claim 14, wherein:

said plurality of AND_OR mask signals are stored as second predetermined bits of the control data stored in the trigger builder control register.

16. The apparatus for producing a trigger signal of claim 13, wherein:

at least one intermediate term unit includes
a plurality of event signal inputs, and
a multiplexer having a plurality of inputs receiving respective event signals, a control input for a multibit select signal and an output, said multiplexer selecting one of said plurality of event signals corresponding to said multibit select signal to produce said intermediate term signal.

17. The apparatus for producing a trigger signal of claim 16, further comprising:

said multibit select signal is stored as second predetermined bits of the control data stored in the trigger builder control register.

18. The apparatus for producing a trigger signal of claim 13, further comprising:

a state extension input receiving a state extension signal;

an OR gate having a first input receiving said single bit output from said look up table, a second input receiving said state extension signal and an output connected to said first input of each of said plurality of AND gates.

19. The apparatus for producing a trigger signal of claim 18, wherein:

said state extension signal corresponds to a state of the data processor.

20. The apparatus for producing a trigger signal of claim 19, further comprising:

a second look up table having a plurality of index inputs receiving respective state bits indicative of the state of said data processor and a single output forming said state extension signal, said look up table loaded with second predetermined bits of data stored in a register.

21. The apparatus for producing a trigger signal of claim 13, further comprising:

a qualification signal input receiving a qualification signal; and said plurality of AND gates each has a third input receiving said qualification signal.

22. The apparatus for producing a trigger signal of claim 21, wherein:

the qualification signal corresponds to a state of the data processor.

23. The apparatus for producing a trigger signal of claim 22, further comprising:

a second look up table having a plurality of index inputs receiving respective state bits indicative of the state of said data processor and a single output connected to said third inputs of each of said plurality of AND gates.

24. The apparatus for producing a trigger signal of claim 13, further comprising:

a state signal decoder having a plurality of inputs receiving corresponding of bits from second predetermined bits of the control data stored in the trigger builder control register and a plurality of outputs, said state signal decoder generating one and only one trigger output enable signal having a first digital state for enabling the corresponding trigger output and other trigger output enable signals having a second digital state opposite to first digital state.

* * * * *